United States Patent
Regnier et al.

(10) Patent No.: US 7,633,766 B2
(45) Date of Patent: Dec. 15, 2009

(54) PREFERENTIAL VIA EXIT STRUCTURES WITH TRIAD CONFIGURATION FOR PRINTED CIRCUIT BOARDS

(75) Inventors: Kent E. Regnier, Lombard, IL (US); David L. Brunker, Naperville, IL (US); Martin U. Ogbuokiri, Aurora, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 12/229,367

(22) Filed: Aug. 22, 2008

(65) Prior Publication Data
US 2008/0318450 A1 Dec. 25, 2008

Related U.S. Application Data

(62) Division of application No. 11/057,262, filed on Feb. 14, 2005, now Pat. No. 7,448,909.

(60) Provisional application No. 60/544,522, filed on Feb. 13, 2004, provisional application No. 60/583,880, filed on Jun. 29, 2004.

(51) Int. Cl.
*H05K 7/00* (2006.01)
(52) U.S. Cl. .................. 361/777; 361/778; 361/799; 361/800; 174/262; 174/261
(58) Field of Classification Search ........... 361/780, 361/794, 748, 749, 751, 762, 767, 778, 777, 361/785, 789, 786, 788, 790, 791, 800, 799, 361/808; 174/250, 262, 253, 261, 264–266, 174/255, 257; 439/608, 69, 91, 591, 22, 439/78
See application file for complete search history.

(56) References Cited

U.S. PATENT DOCUMENTS

| | | | |
|---|---|---|---|
| 3,411,148 A | 11/1968 | Fetterrolf et al. |
| 3,871,728 A | 3/1975 | Goodman |
| 5,157,477 A | 10/1992 | Chance |

(Continued)

FOREIGN PATENT DOCUMENTS

EP 1 182 913 2/2002

(Continued)

OTHER PUBLICATIONS

International Search Report for PCT/US2005/004469 (Oct. 7, 2005).

*Primary Examiner*—Dean A. Reichard
*Assistant Examiner*—Hoa C Nguyen
(74) *Attorney, Agent, or Firm*—Stephen L. Sheldon

(57) ABSTRACT

A circuit board design is disclosed that is useful in high-speed differential signal applications uses either a via arrangement or a circuit trace exit structure. A pair of differential signal vias in a circuit board are surrounded by an opening that is formed within a ground plane disposed on another layer of the circuit board. The vias are connected to traces on the circuit board by way of an exit structure that includes two flag portions and associated angled portions that connect the flag portions to circuit board traces. In an alternate embodiment, the circuit board traces that leave the differential signal vias are disposed in one layer of the circuit board above a wide ground strip disposed on another layer of the circuit board.

12 Claims, 11 Drawing Sheets

U.S. PATENT DOCUMENTS

| | | | |
|---|---|---|---|
| 5,757,252 A | 5/1998 | Cho et al. | |
| 6,350,134 B1 | 2/2002 | Fogg et al. | |
| 6,384,341 B1 | 5/2002 | Rothermel et al. | |
| 6,388,208 B1 | 5/2002 | Kiani et al. | |
| 6,528,737 B1 | 3/2003 | Kwong et al. | |
| 6,534,854 B1 | 3/2003 | Fazelpour et al. | |
| 6,767,252 B2 | 7/2004 | McGrath et al. | |
| 6,891,272 B1 * | 5/2005 | Fjelstad et al. | 257/774 |
| 7,013,452 B2 * | 3/2006 | Baras et al. | 716/15 |
| 7,116,190 B2 | 10/2006 | Brunker et al. | |
| 7,151,420 B2 | 12/2006 | Brunker et al. | |
| 7,154,355 B2 | 12/2006 | Brunker et al. | |
| 7,157,987 B2 | 1/2007 | Brunker et al. | |
| 7,209,368 B2 * | 4/2007 | Lauffer et al. | 361/816 |
| 7,242,592 B2 * | 7/2007 | Payne et al. | 361/792 |
| 2002/0111068 A1 | 8/2002 | Cohen et al. | |
| 2002/0179332 A1 * | 12/2002 | Uematsu et al. | 174/262 |
| 2003/0150643 A1 * | 8/2003 | Juntwait et al. | 174/261 |
| 2004/0039859 A1 | 2/2004 | He et al. | |
| 2004/0150970 A1 * | 8/2004 | Lee | 361/794 |
| 2004/0189418 A1 * | 9/2004 | Bartley et al. | 333/4 |
| 2005/0011676 A1 | 1/2005 | Barr et al. | |
| 2005/0082087 A1 * | 4/2005 | Geva et al. | 174/255 |
| 2005/0151604 A1 | 7/2005 | Brunker | |
| 2005/0201065 A1 | 9/2005 | Regnier et al. | |
| 2005/0247482 A1 * | 11/2005 | Nakamura | 174/262 |
| 2006/0042828 A1 * | 3/2006 | Matsuo | 174/255 |
| 2006/0091545 A1 | 5/2006 | Casher et al. | |
| 2006/0139117 A1 | 6/2006 | Brunker et al. | |
| 2006/0185890 A1 * | 8/2006 | Robinson | 174/255 |
| 2006/0266549 A1 * | 11/2006 | Lin et al. | 174/262 |

FOREIGN PATENT DOCUMENTS

| | | |
|---|---|---|
| EP | 1 239 552 | 9/2002 |
| JP | 04268787 | 4/1994 |
| JP | 11225594 | 2/2001 |

* cited by examiner

PRIOR ART

FIG. 3
(PRIOR ART)
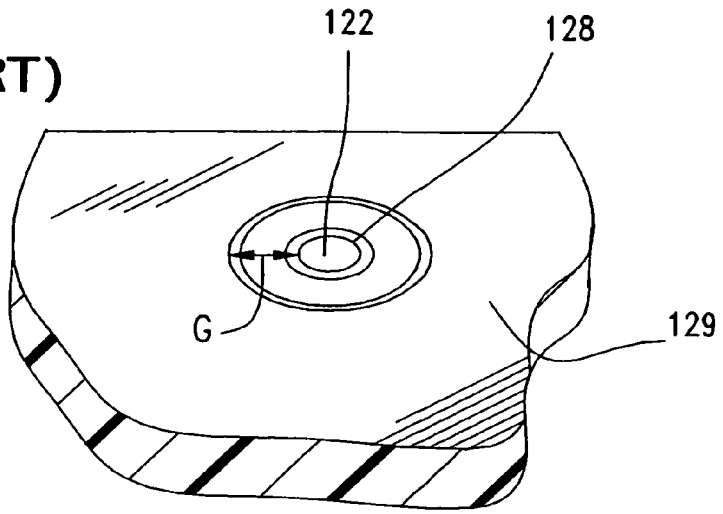
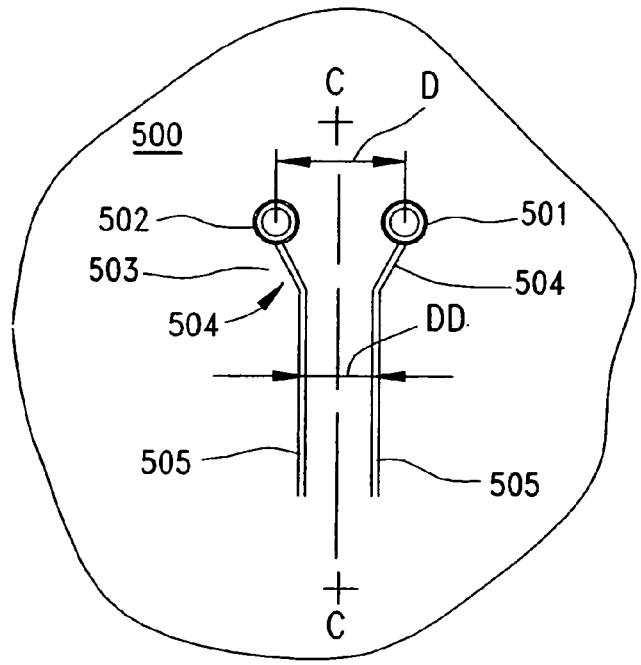
FIG. 14
(PRIOR ART)
FIG. 15
(PRIOR ART)
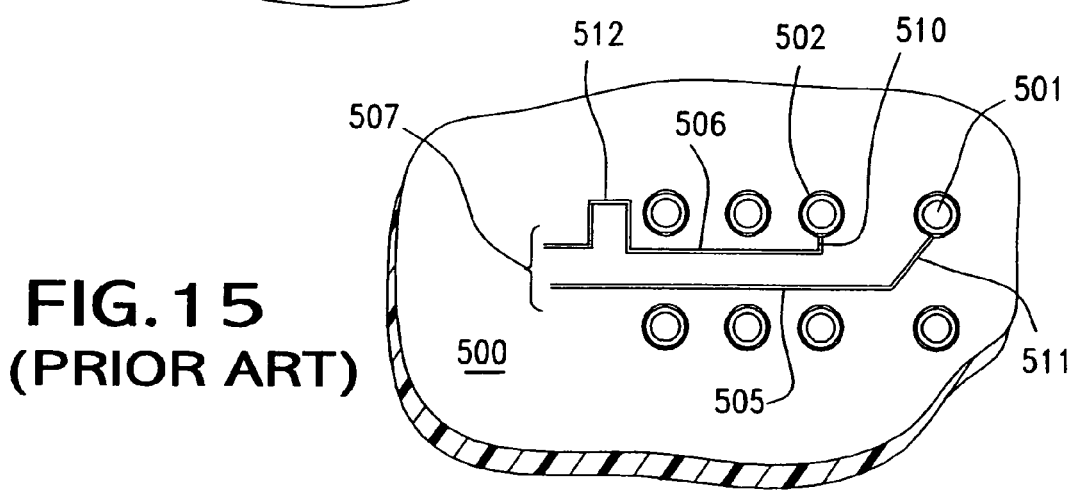

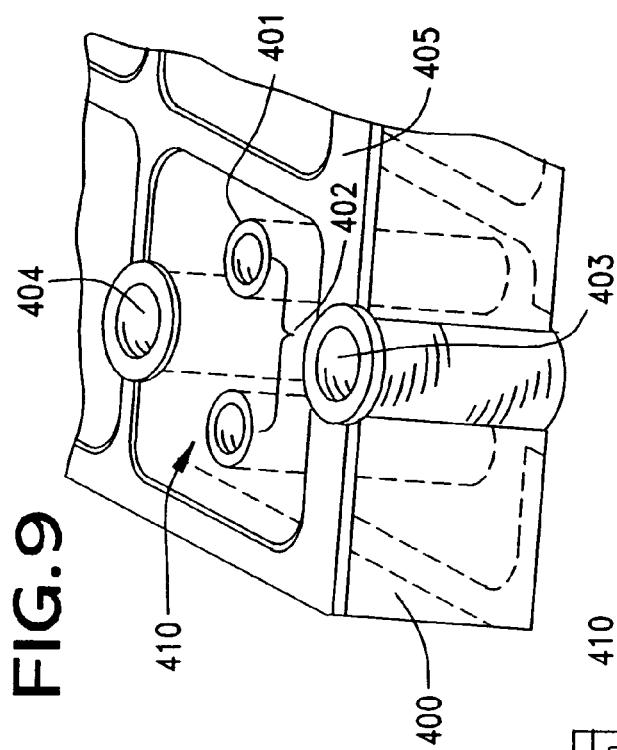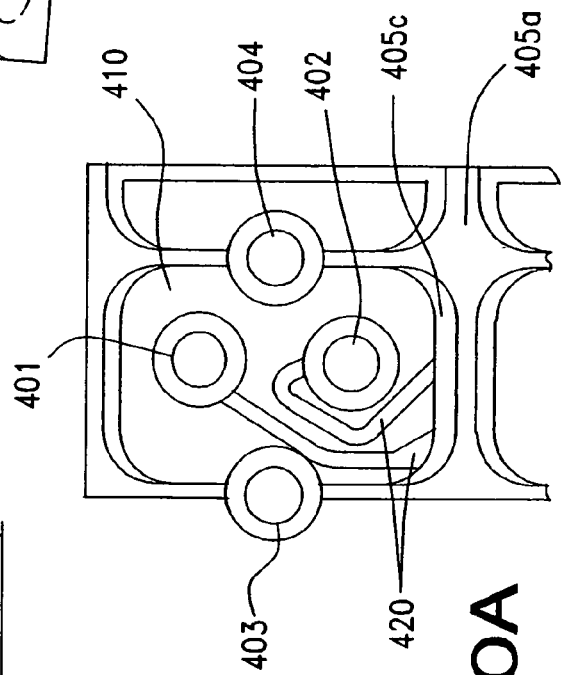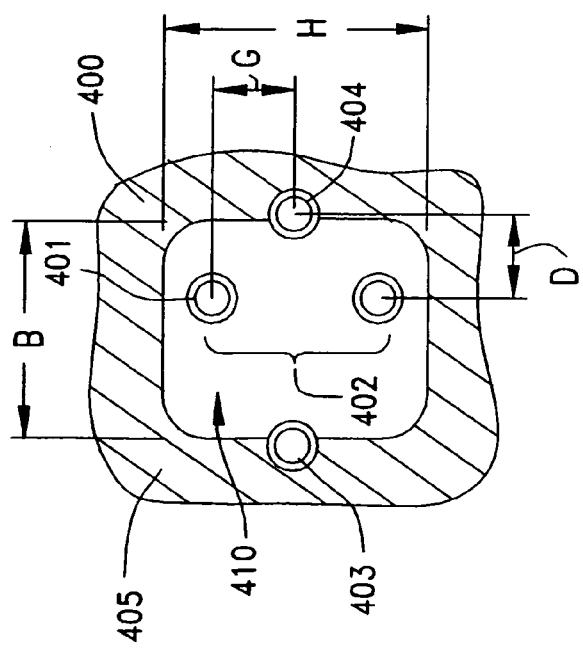

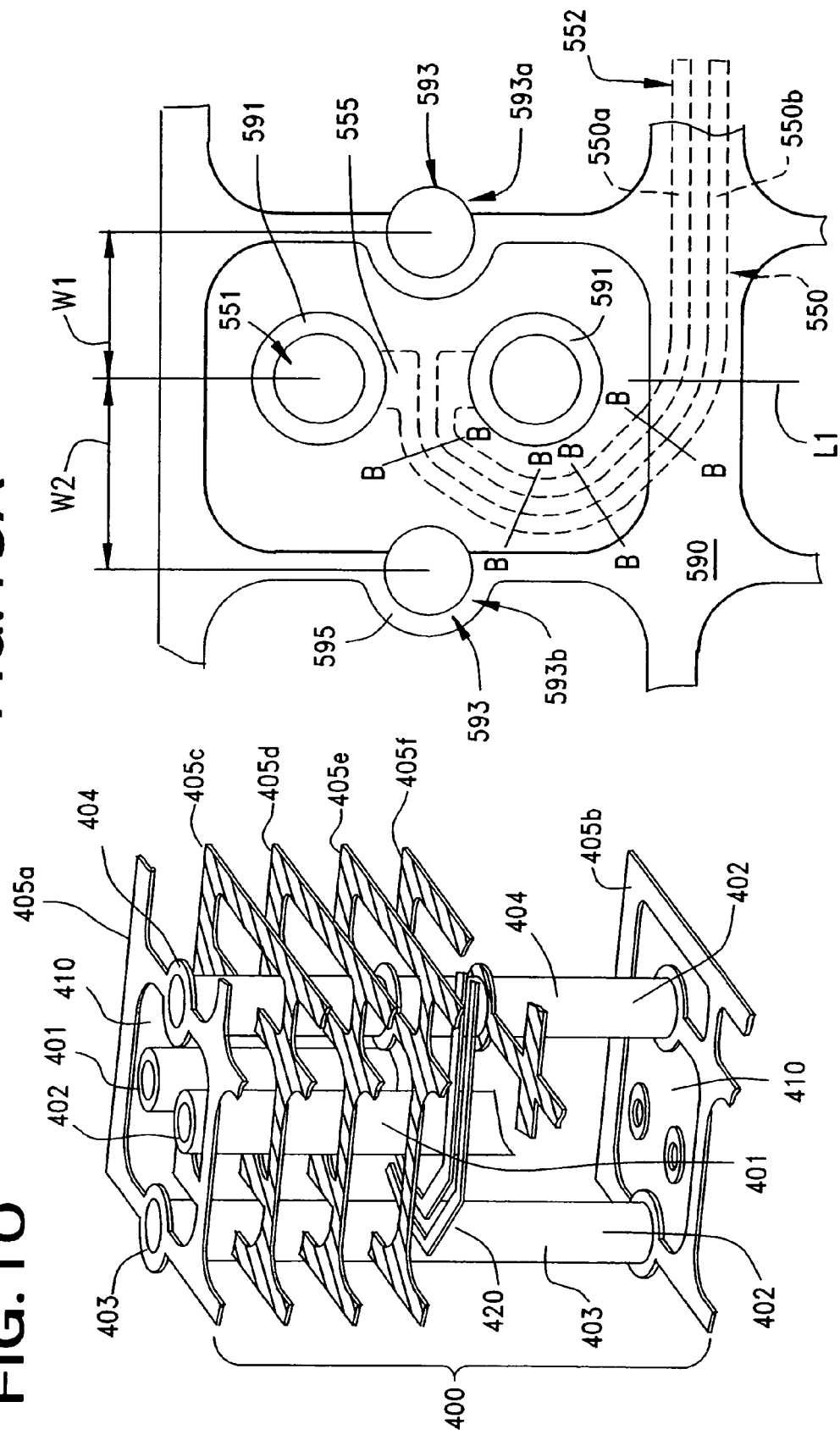

PREFERENTIAL VIA EXIT STRUCTURES WITH TRIAD CONFIGURATION FOR PRINTED CIRCUIT BOARDS

REFERENCE TO RELATED APPLICATIONS

This application claims priority of prior U.S. provisional patent application Nos. 60/544,522 filed Feb. 13, 2004 and 60/583,880, filed Jun. 29, 2004.

BACKGROUND OF THE INVENTION

The present invention relates generally to circuit board arrangements, and more particularly to via arrangements that are used on printed circuit boards for high-speed electrical transmission applications.

In the field of data communication, data transfer speeds have steadily increased over the years. This increase in speed has required the development of high-speed electronic components for use in the telecommunications field, such as Internet use and use in data transfer and storage applications. In order to obtain an increase in the speed at which electrical signals are transmitted, it is known to use differential signals.

Twisted pair wires are commonly used to transmit differential signals and are most commonly used in electrical cables. These signal cables have one or more twisted pairs of wires that are twisted together along the length of the cable, with each such twisted pair being encircled by an associated grounding shield. These twisted pairs typically receive complimentary signal voltages, i.e., one wire of the twisted pair will carry a +1.0 volt signal, while the other wire of the twisted pair will carry a −1.0 volt signal. The wire pairs are twisted together along the axis of the cable so that each of the wires extends in a helical path along the cable and the wires are spaced apart from each other the same distance along this helical path for the length of the cable.

As the signal cables are routed on a path to an electronic device, they may pass by or near other electronic devices that emit their own electric field. These devices have the potential to create electromagnetic interference in the transmission lines formed by the signal cables. However, the twisted pair construction of the cables minimizes or diminishes any induced electrical fields by maintaining the two wires in a desired orientation so that they will capacitively couple to each other and to an associated grounding shield or drain wire, and this construction thereby substantially prevents electromagnetic interference from occurring in the cable and affecting the transmission of data signals through the cable.

In order to maintain electrical performance integrity from such a transmission line to the circuitry of an associated electronic device, it is desirable to obtain a substantially constant impedance throughout the transmission line, from circuit to circuit and to avoid large discontinuities in the impedance of the transmission line. Large discontinuties in the impedance of the transmission line can lead to the generation of undesireable crosstalk between the signal paths of the transmission line or elecrical "noise". Both this type of noise and crosstalk adversely affect the integrity of electrically transmitted signals at high frequencies (or data transfer speeds). The "transmission line" between electronic devices not only includes cables and connectors that interconnect two devices together, but also includes the printed circuit boards of the devices.

The impedance of twisted pair transmission cables may be controlled because it is easy to maintain a specific geometry or physical arrangement of the signal conductors and the grounding shield, an impedance change will usually encountered in the area where a cable is mated to a connector, where the connector is mounted to a printed circuit board and where the connector is mounted to a circuit board. This last area is referred to in the art as the "launch" area" where signals are launched from the transmission lines on (or in) the circuit board into a connector mounted thereto. Likewise, the signals may be launched from the connector into the circuit board and this area is commonly also referred to as an "exit" area. These areas are the same but may have different terms depending on the orientation and direction of the signal path, either from the circuit board to the connector or from the connector to the circuit board. The present invention is directed to improved structures used in these circuit board launch or exit areas.

Circuit boards are made up of multiple layers of conductive and nonconductive material. Each layer may be considered as defining one of multiple planes of the circuit board. A nonconductive layer may be used as a base of the circuit board and a surface or surfaces thereof may be coated with a conductive material such as a copper foil or plating. Portions of this are removed to form conductive extents on the surfaces of the board which are typically referred to in the art as "traces". These traces define circuit paths on the board base layer. A subsequent nonconductive layer is then applied onto the surfaces of the base layer and another conductive coating is applied to that layer and etched into a pattern. A third nonconductive layer is applied over this second conductive layer and the process is repeated until a multi-layer circuit board is formed. The different conductive layers are typically connected together by what are known in the art as "vias". A via is a hole that is drilled through the circuit board and the inner surface of which is plated. This plating interconnects the various conductive layers. The traces on the circuit board may lead to a via location when it is desired to connect the traces to other traces. Similarly, the vias may also be used to receive through-hole mounting pins or other mounting pins of connectors.

Pairs of traces may be formed in a circuit board layer to carry a pair of differential signals and each pair will define a differential signal transmission line of the circuit board. Each circuit board layer or plane, may support one or more such differential signal transmission lines. It is important to control the impedance of these transmission lines to minimize crosstalk and electrical interference during operation of the devices without unduly complicating the circuit board design and the circuit layouts on the circuit board.

The present invention is therefore directed to a circuit board design, utilizing circuit board vias and exits of conductive traces from the vias tat cooperatively define an electrical signal transmission line, to provide a high level of operational performance and which maintains the desired electrical characteristics, such as the impedance of the circuit board signal transmission lines.

SUMMARY OF THE INVENTION

Accordingly, it is a general object of the present invention to provide a circuit board structure for use in high speed signal transmission wherein a ground plane is provided for a differential signal transmission line on the circuit board and is positioned in a preferential location with respect to where the differential signal traces connect to a via on the circuit board so that each differential signal trace and its corresponding via pair engages in electrical coupling with the ground rather than with a nearby differential signal transmission line, which is made up of a pair of conductive traces and vias.

Another general object of the present invention is to provide an improved circuit board structure in which the configuration of a pair of conductive differential signal traces leading to or away from a via is specifically configured to control the impedance of the conductive traces that make up a differential signal transmission line on the circuit board.

Another object of the present invention is to provide a printed circuit board structure that may be used as either a "launch" or an "exit" area for mating with electronic components, such as electrical connectors, in which the structures include a pair of differential signal traces mated to through hole vias in the circuit board, and wherein the traces have a particular structure in the area where they exit from the vias so as to affect the impedance of the differential signal system A further object of the present invention is to provide an improved circuit board construction wherein a pair of differential signal vias are positioned proximate to an associated ground via, the circuit board having at least one ground plane layer formed therein, and the ground plane having an anti-pad formed therein that encompasses the two differential signal vias and which is connected to the associated ground via and another ground via associated with another pair of differential signal vias, and another anti-pad that is positioned adjacent to the one anti-pad and encompassing a second, adjacent pair of differential signal vias, but contacting a second ground via associated with the adjacent pair of differential signal vias.

Still a further object of the present invention is to provide a circuit board with a new exit pattern for conductive traces leading from a pair of differential signal vias, the exit pattern including a bend in each of the exit portions of the traces, one bend of one of the trace exit portions lying inside of a bending radius of the other, outer trace exit portion, so that one of the trace exit portions is generally spaced apart from each other a similar and consistent distance from the body of the transmission line which they define to the position where one of the traces exits from an associated via.

Yet another object of the present invention is to provide an pattern for a pair of conductive circuit board traces exiting a pair of respective differential signal vias and leading to a differential signal transmission line on the circuit board, each of the traces including a conductive collar portion that encircles and contacts a corresponding via, an exit portion extending from the collar portion and terminating in the signal transmission portion, the exit portion including an increased width portion, the signal transmission portion extending lengthwise along an extent of the circuit board that is spaced apart from the pair of differential signal vias and which does not intersect the vias, the exit portions including at least one change of direction in order to meet with the signal transmission line.

Still yet a further object of the present invention is to provide a circuit board having the differential signal via trace exit pattern described above, and the circuit board including a plurality of ground plane layers, each of the ground plane layers having an anti-pad, the perimeter of which encompasses the collar and exit portions of the pair of differential signal traces.

Yet it is still another object of the present invention to provide circuit board trace patterns that are used to provide exits or routes out from -circuit board vias in which the impedance of the transmission lines formed on the circuit board is controlled by positioning a ground trace in proximity to a pair of differential signal traces, thereby forming a "triad" of circuit board traces where the two differential signal traces and the associated ground trace are located at apexes of an imaginary triangle.

Still a further object of the present invention is to provide an arrangement of differential signal traces and an associated ground trace that provide a transmission line path on or in a printed circuit board that promotes capacitive coupling among the differential signal and ground traces to thereby regulate the impedance of the transmission line from their exit from the circuit board vias to other destinations on the circuit board.

Yet still a further object of the present invention is to provide a circuit board conductive trace arrangement for use as an exit structure of such traces from a pair of conductive vias disposed on the circuit board, each of which is utilized to transmit electrical signals of differential signal circuits, the circuit board including a conductive ground plane layer with an opening formed therein, the opening encompassing the pair of differential signal vias, and the exit structure includ8ing a pair of enlarged conductive portions extending away from the vias toward each other and being spaced apart from each other by an intervening space, the enlarged portions subsequently narrowing down to thinner portions, also separated from each other by an intervening space, the thinner portions communicating with thin trace portions in an area of the circuit board which is outside of the pair of vias.

The present invention provides these objects, advantages and benefits by way of its structure. In one principal aspect of the present invention, four vias are provided on a circuit board. Two of the vias are designated as differential signal vias and as such, they include conductive traces that lead away from the differential signal vias within or on a layer of the circuit board and these traces define a differential signal transmission line of the circuit board layer. The remaining two vias are designated a ground vias and as such, they are connected to a ground reference plane, which is preferably in a plane or layer of the circuit board other than the plane or layer in which the differential signal transmission line extends. The ground reference plane is formed in a manner so that it has an opening formed therein that encompasses the pair of two differential signal vias. The ground reference plane is connected to both of the ground vias. The four vias are arranged at the corners of an imaginary four-sided figure, such as a square, rectangle, rhombus of the like and the ground reference plane may be solid and planar, or it may have a grid, or lattice-like, structure.

In another principal aspect of the present invention, a new launch, or exit, pattern for conductive traces leading from a pair of differential signal vias is provided. The exit pattern includes a pair of conductive traces that extend in a plane or layer of the circuit board from a pair of associated vias, preferably a pair of differential signal vias and each of the traces includes a bend within its launch or exit portion of the trace. One bend of one of the trace exit portions is disposed inside of a bending radius of the other, (and outer) trace exit portion, so that the spacing of the pair of trace exit portions from each other is generally a similar and consistent distance from an associated via to the body of the transmission line.

In yet another principal aspect of the present invention, a pattern for a pair of conductive circuit board traces exiting (or entering) a pair of respective differential signal vias and leading to a differential signal transmission line on the circuit board is provided. Each of the traces includes a conductive collar portion that encircles and contacts a corresponding via, and it further includes an exit portion that extends from the collar portion and joins to or terminates at the signal transmission line. The exit portion includes an increased width portion, and in one embodiment, this increased width portion may begin at near the centerline that runs from the center of one differential signal via to the other differential signal via.

This increased width portion extends and may traverse at least one bend in its path to the signal transmission line, where it terminates by reducing down in width to that of the signal transmission line to which it is joined.

In another embodiment, the increased width portions have a configuration of a "flag", when viewed from above or from a direction normal to the plane of the conductive trace. The increased width portions also approach each other in a close spacing for coupling purposes. The increased width portions shall usually traverse at least one bend, or change in direction along their path from their vias to the signal transmission lines. In the preferred embodiments of the invention these flag portions of the pair of differential signal traces are evenly sized and symmetrical with each other.

As exemplified in another embodiment of the present invention, the impedance of the transmission lines formed on the circuit board, and particularly the exit or launch portions thereof may be controlled by positioning a ground trace in proximity to a pair of differential signal traces. The ground trace is positioned adjacent to the differential signal traces, but in different layers of the circuit board so that the three traces may be considered as forming a "triad" of circuit board. This triad configuration is best viewed from an end in a section through the circuit board, where the two differential signal traces and the associated ground trace are located at apexes of an imaginary triangle.

This triad arrangement within the layers of the circuit board promotes capacitive coupling among the differential signal and ground traces. In this manner, the impedance of the transmission line may be regulated from its exit portions from the vias of the circuit board to other destinations on the circuit board.

Such a circuit board conductive trace arrangement may further include a conductive ground plane layer with an opening. This opening, as with other embodiments of the invention, encompasses a pair of differential signal vias. The ground plane of one of the circuit board layers that lie adjacent to the layers supporting the differential signal traces may have a thin strip disposed on it that runs through, and preferably bisects, the non-conductive opening. This bisector strip runs between and underneath or above the transmission line portions of the two differential signal vias, and so creates a triad arrangement of the three traces that comprise the differential signal trace pair and their associated ground.

In another aspect, the differential signal traces are routed out from their associated signal vias on the circuit board along a common axis. A pair of ground vias is arranged along the same axis as the signal vias and are spaced further outside of the signal vias along the axis. Two ground exit traces having a relative wide width extend (in plane adjacent to the plane of the signal trace exit portions) from the ground vias toward a center point between the signal vias, where they join together and change direction. The direction change is one that matches the change in direction, or routing, of the differential signal vias as they move from their exit portions to the transmission line portions. Along this extent, the ground via exit trace has a width that is large enough to present a wide ground element tot he two differential signal vias. Preferably, the width of this ground via exit trace extends between the outer edges of the differential signal vias from a preselected distance, which may include the entire length of the signal transmission line.

These and other objects, features and advantages of the present invention will be clearly understood through a consideration of the following detailed description.

BRIEF DESCRIPTION OF THE DRAWINGS

In the course of this detailed description, the reference will be frequently made to the attached drawings in which:

FIG. 3 is a perspective view of a via opening on to the surface of a circuit board;

FIG. 8 is the same view as FIG. 7, but with a wide ground plane layer in place on top of the circuit board for clarity purposes and connected to two ground vias and illustrating the dimensional arrangement of the open area surrounding the pair of differential signal vias;

FIG. 9 is a perspective view of the via arrangement similar to that of FIG. 8 showing the points of interconnection between the ground plane, which is illustrated on the top surface of the circuit board section and two of the ground vias, the ground plane having a grid or lattice-like configuration, and having an open area with a perimeter that encompasses a pair of differential signal vias;

FIG. 10 is a perspective view of the arrangement of vias in FIG. 9, but illustrating additional ground plane layers as part of the overall circuit board construction, with the open areas encompassing the pair of differential signal vias through the height, or depth, of the circuit board, with the ground planes being selectively connected to the ground vias of the arrangement;

FIG. 10A is a top plan view of the via and ground plane arrangement of FIG. 10, further illustrating a pair of differential signal transmission line traces exiting from a pair of associated differential signal vias;

FIG. 13A is a top plan view of another conductive trace exit pattern constructed in accordance with the principles of the present invention;

FIG. 14 is a plan view of a known differential signal via arrangement and a pair of circuit traces exiting therefrom;

FIG. 15 is a plan view of another known differential signal via arrangement, with a pair of traces exiting therefrom and forming a signal transmission line of the circuit board;

DETAILED DESCRIPTION OF THE PREFERRED EMBODIMENTS

Figure 1:
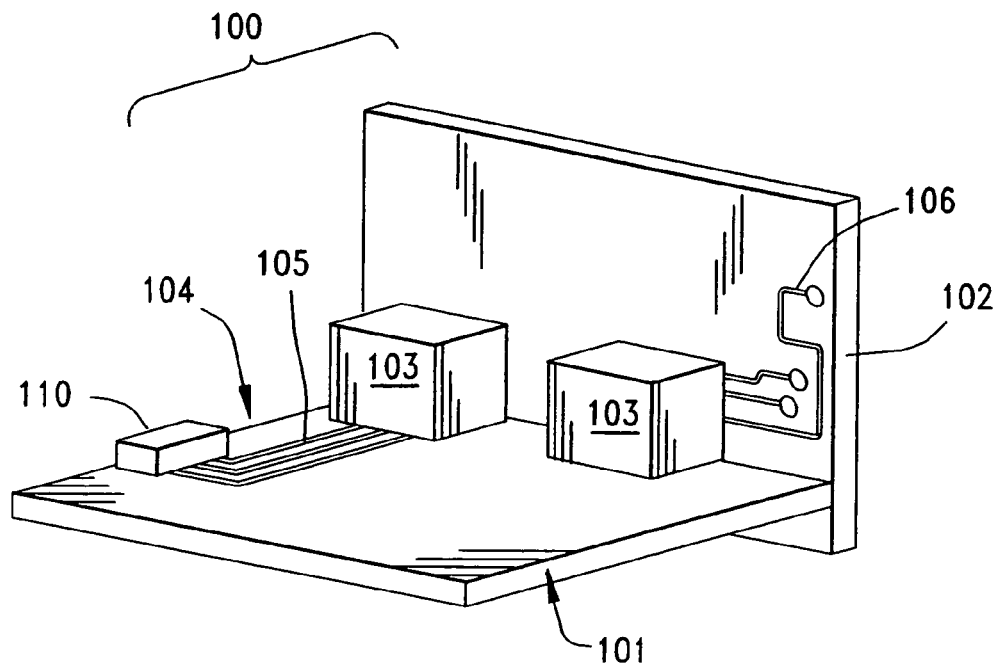
FIG. 1 is a schematic view of the environment in which the present invention is used, namely, in a backplane environment for high-speed signal and data transfer applications.

FIG. 1 is a perspective view of a backplane assembly 100 in which a printed circuit board, referred to herein as a "motherboard" 101 is joined to a secondary circuit board 102 by way of one or more connectors 103. The connectors 103, as are known in the art, connect conductive circuits 104 which utilize conductive traces 105 disposed on a surface of the motherboard 101, to similar circuits 106 disposed on the secondary circuit board 102. These circuits 104, 106 typically lead to electronic components 110 that are mounted to the circuit board.

Cables may be used to connect the assembly 100 of FIG. 1 to another electronic assembly and these cables are but one form of an electronic signal transmission line. Other forms of such transmission lines may be incorporated in the circuit boards 104, 106 of the assembly and one such form may take the form of a plurality of conductive traces disposed on or within a plane, or layer, of the circuit board. An example of such a transmission line is shown in FIG. 2 and is representative of the circuit board structure that is used in the electronics industry today.

Figure 2:
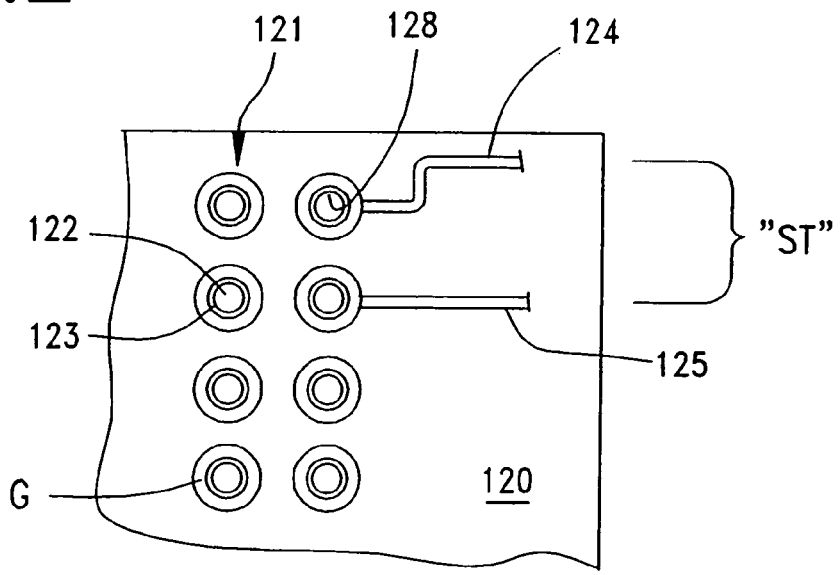
FIG. 2 is a plan view of a known circuit board structure with two vias formed therein.

In FIG. 2, a circuit board 120 is shown having a plurality of vias 121 arranged in a pattern for receiving corresponding conductive tails of an electronic component that is mounted to the circuit board 120 and which is not shown. The vias 121 typically include a hole 122 that extends through the entire thickness of the circuit board 120. The vias 121 are plated along their interior surfaces 128, and the vias 121 typically include a small annular ring of plating material 123 that can collect at the intersection of the hole and the surfaces of the circuit board 120. A pair of conductive traces 124, 125 are shown extending away from the vias 121 and, in differential signal applications, two of the traces 124, 125 will cooperatively define a differential signal transmission line "ST" that leads to a connector, electronic component or the like.

In this manner, the likelihood that the differential signal pair will be split into multiple single-ended signals is reduced. The differential signal vias 401 are seen to penetrate the top metal ground plane layer 405 of the circuit board 400 and having a separation spacing (center-to-center) that is less than either B or H, the outer dimensions of the anti-pad. In this manner, the anti-pad is effectively decoupled from the differential signal pair and common mode coupling is minimized, while differential mode coupling between the two differential signal vias is increased.

The vias 121 are used not only to mount connectors and components to the circuit board 120, but are also used to interconnect various circuit of the board together. As stated above, a circuit board is typically made up on a series of layers of a fiberglass resin or similar compound. A plating layer is applied to one of these layers and is etched to form conductive traces on the surface of the layer. Another layer of fiberglass or resin is applied to the first layer, circuit traces are formed and so on until a multi-layer circuit board is formed with a plurality of circuits extending through the board on the different layers thereof. The vias are formed by drilling holes into the circuit board and exposing the conductive layers and then the inner surfaces of the vias are plated, thereby connecting together, all of the layers that touch the hole edge.

FIG. 3 illustrates in enlarged detail, a layer of the circuit board 120 that contains a via 121. The via is plated and includes an interior coating 128 of plating material that surrounds the hole 122. A gap G may be formed on the board layer and this gaps provides separation between the via plating 128 and a ground reference plane conductive layer 129 that surrounds the via 121. This gap G is provided to provide protection against shorting and it has been discovered that the ground plane layer may detrimentally influence the transmission of differential signals from a pair of differential signal vias. However, with this structure, the gap G that occurs between the via and the edge of reference plane causes the via to as a capacitor toward the reference plane. This effect is especially pronounced in structures where there are multiple ground planes with gaps or openings that surround a single via it can cause signal reflection. This reflection takes energy out of the overall transmission line system.

Figure 3A:
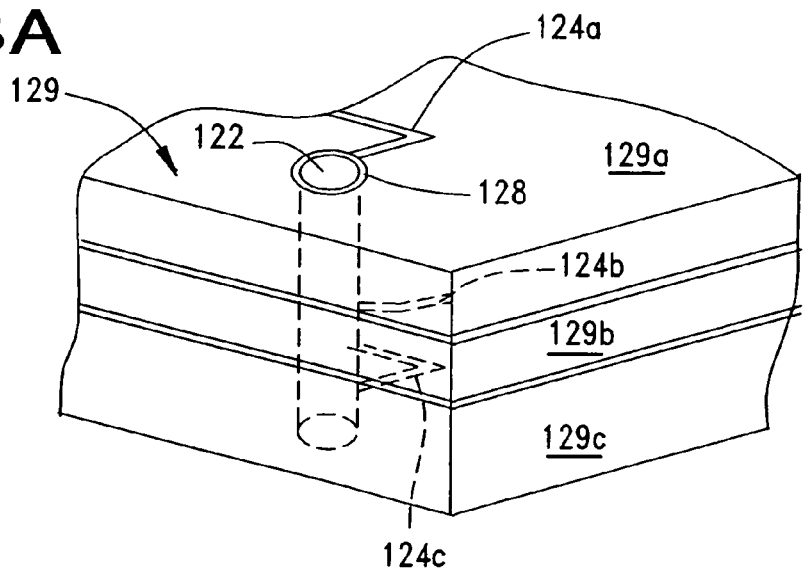
FIG. 3A is a diagrammatic, detailed view of a known printed circuit board with a via formed in place in the body of the circuit board and extending completely through the circuit board, and the circuit board having multiple ground planes arranged as layers within the body or between other layers of the circuit board.

FIG. 3A illustrates in a schematic manner, the different layers 129a, 129b and 129c of the circuit board 129 and how the via hole 122 extends through all of the layers 129a-c in order to mate with surface trace 124a and inner layer traces 124b and 124c.

Figure 4:
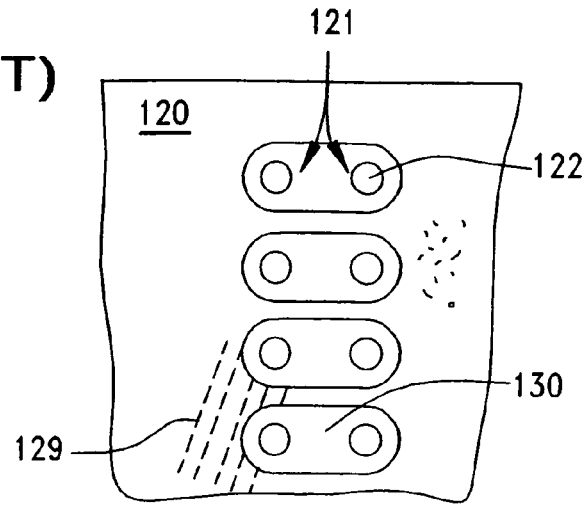
FIG. 4 is a plan view of another known circuit board arrangement for differential signal applications and illustrating two differential signal vias of the circuit board being surround by an non-conductive area that is formed in a conductive ground plane that surrounds pairs of the vias.

One manner of improving the performance of differential signal vias on a circuit board is that which is illustrated in FIG. 4 and which described in U.S. Pat. No. 6,607,402, issued Aug. 19, 2003 and assigned to Teradyne, Inc. In this patent, a circuit board 120 is shown having a plurality of vias 121 formed therein. The vias 121 are arranged in pairs for differential signal transmission, and the circuit board 120 contains a ground reference plane 129. A portion 130 of the underlying ground plane area which encircles the a pair of differential signal vias is removed to form an opening. This removed area, or opening 130, is commonly referred to in the art as an "anti-pad". The '402 patent explains that the anti-pad 130 should encircle the two vias 121. This structure has certain disadvantages associated with it. For example, the vias 121 both act as capacitors in multiple places across the gap between the vias 121 and edge of the ground plane opening. This capacitor effect tends to take energy out of any signal transmission line that may be joined to the vias 121. The use of this small-sized via anti-pad is an attempt to loosely couple the two signal vias 121 together electrically, but the proximity of the surrounding ground pad or plane inhibits true strong differential coupling between the two differential signal vias 121.

Figure 5:
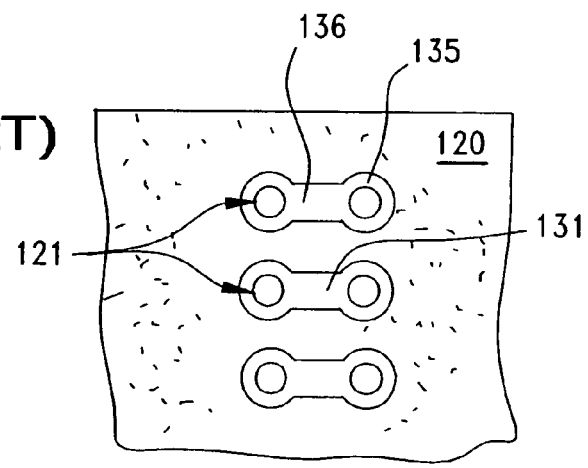
FIG. 5 is a plan view of yet another known circuit board arrangement with two vias formed therein, similar to that shown in FIG. 4, and wherein the ends of the nonconductive areas surrounding the vias are enlarged with respect to the remainder of the non-conductive area, to give the open area a "dogbone" or "dumbbell" shape.

FIG. 5 illustrates another known modification to circuit board vias, in which an anti-pad 131 is narrowed in its center portion 133 between the two vias 121 to adopt an overall "dogbone" or "dumbell" appearance. With this appearance, the anti-pad 131 is large in the area 135 surrounding the pair of vias 121, but it then narrows down a bit between in the area 136 between the two vias. This narrowing results in a recapture of some of the system energy that is normally lost in operation, but the small area of the ground plane anti-pad inhibits proper performance. This structure represents an attempt to balance the capacitance of the system and to loosely couple the two signal vias together while still keeping the affinity of the two signal vias for their surrounding ground plane.

Assymmetrical Peferential Via Positioning

Figure 6:
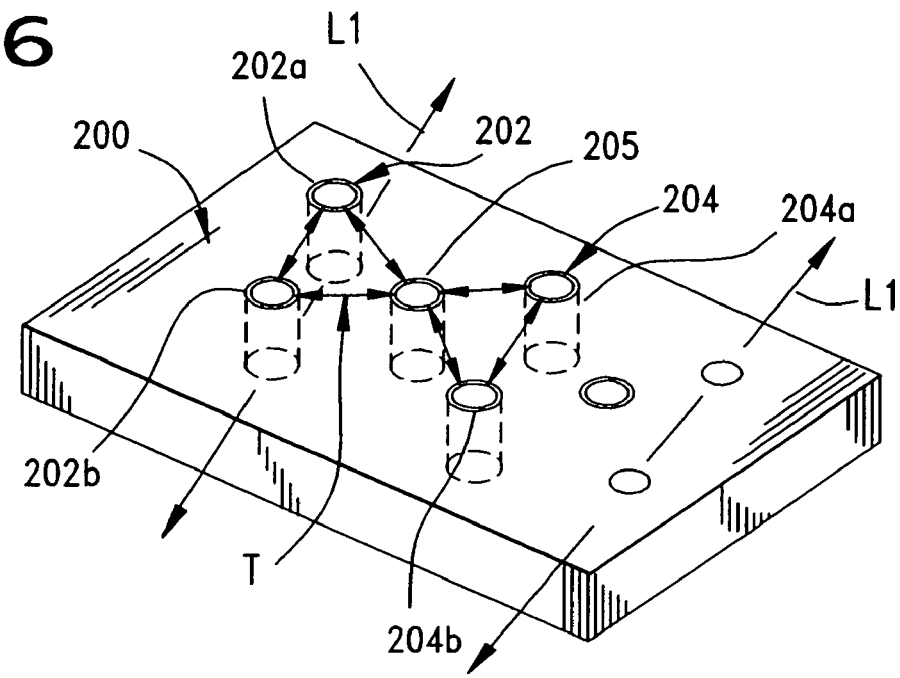
FIG. 6 is a perspective view of a circuit board illustrating a 5-die pattern of vias that may be used for differential signal applications.

FIG. 6 illustrates another circuit board 200 have what is referred to herein as a "5-die" via pattern formed therein. This pattern includes two pairs of differential signal vias 202, 204 positioned on opposite sides of a single intervening ground via 205. Each such pair of differential signal vias includes two distinct vias 202a, 202b and 204a, 204b. The two vias of each such differential pair are typically aligned together along a first axis L1 (shown extending from lower left to upper right in FIG. 7). This pattern is repeated along a direction that is transverse to the first axis L1. The differential signal vias 202a-b, 204a-b typically have conductive traces leading from them to another destination on the circuit board 200, while the ground via 205 is typically connected to a ground plane layer disposed within the circuit board 205 on an inner surface thereof and not sown in FIG. 6.

In this type of via pattern, two pairs of differential signal vias each share the single ground via in the center of the pattern. It has been discovered by us that this 5-die pattern creates crosstalk and it is difficult to very finely control the impedance of such a system. The grouping of one of the differential via pairs 202, 204 and the center ground via is preferably triangular in configuration with the three vias being located at the vertices of imaginary triangles represented by the bold lines T in FIG. 6.

Figure 7:
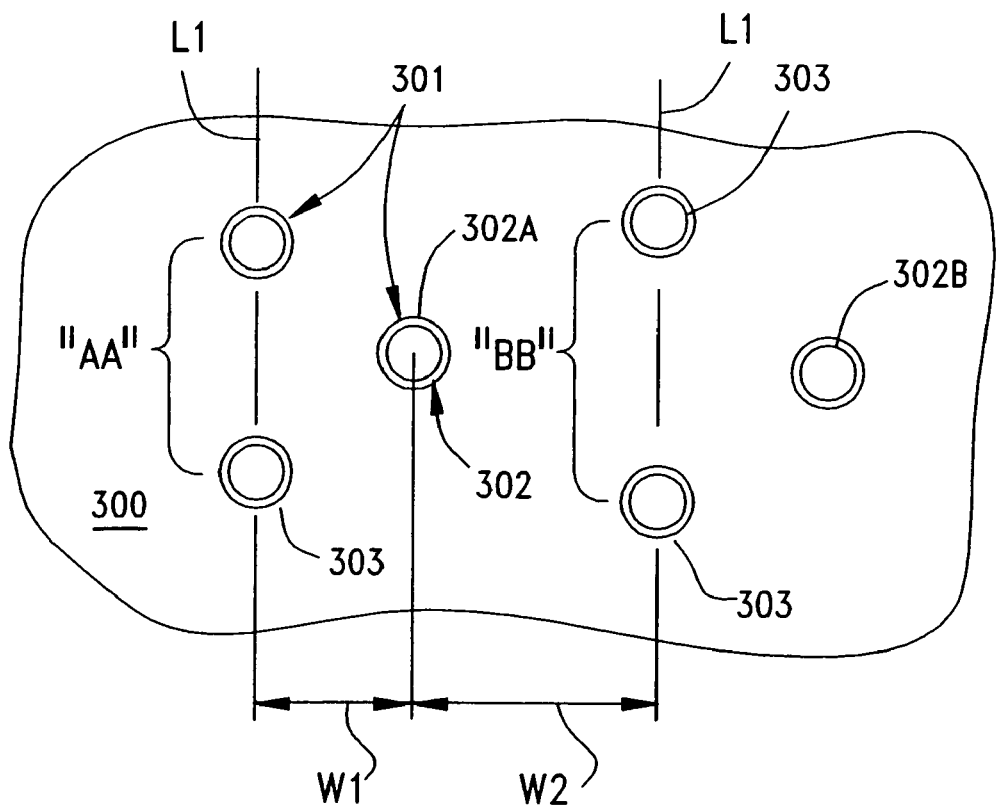
FIG. 7 is a plan view of a circuit board via arrangement constructed in accordance with the principles of the present invention, illustrating a preferential ground arrangement.

FIG. 7 is a top plan view of a circuit board 300 with a via layout constructed in accordance with the principles of the present invention in which the spacing of the vias is staggered so that one pair of differential signal vias "AA" is located closer to their associated ground via 302 (shown in approximately the center of the pattern) than are a second pair "BB" of differential signal vias. Multiple vias 301 are formed in the circuit board 300 and an associated ground via 302 is provided in association with and preferably aligned with a pair of differential signal vias 303. The two differential signal vias 303 are preferably aligned along a first axis L1 to form a pair of differential signal vias, and the associated ground via 302 is spaced apart from the first axis, but located between the two signal vias when viewed in a direction transverse to the first axis L1.

We refer to this structure as a "preferential ground" via layout because the spacing W1 between one differential signal via pair AA and its associated ground via 302 is less than the spacing W2 between the one differential signal via pair AA and another, adjacent pair BB of differential signal vias 306. In this manner, the one pair of differential signal vias AA is biased in its coupling toward its associated ground 302 and not toward either the other, adjacent differential signal via pair BB or the ground via 302b associated with that differential signal via pair BB.

FIGS. 8-10 illustrate another embodiment of the present invention in which one or more ground reference planes of the circuit board are provided with a specially configured anti-pad that encompasses the two differential signal vias that make up a differential signal via pair. The dimensional relationship of these arrangements is first shown in FIG. 8, where reference number 400 indicates the circuit board, which includes a plurality of signal vias 401, two of which are combined to form a pair 402 of differential signal vias. A large ground plane 405 is present either on the surface of the circuit board or on an interior layer thereof. The ground plane 405 has a large anti-pad 410 formed in it, and as can be seen in FIG. 8, the anti-pad 410 is generally rectangular in shape, having dimensions B and H as shown. It is preferred that the opening have an aspect ratio AR of from about 1.2 to 1.5, which is obtained by the equation:

$$AR=H/B.$$

The ground plane 405 surrounding the pair 402 of differential signal vias 401 may be a large ground plane, as illustrated. In this manner, the likelihood that the differential signal pair will be split into multiple single-ended signals is reduced. The differential signal vias 401 are seen to penetrate the top metal ground plane layer 405 of the circuit board 400 and have a separation spacing (center-to-center) that is less than either B or H, the outer dimensions of the opening, or anti-pad 410. In this manner, the anti-pad 410 is effectively decoupled from the differential signal pair and common mode coupling is minimized, while differential mode coupling between the two differential signal vias is increased.

Additionally, one via 404 of the two ground vias 403, 404 is defined as a preferential ground, meaning that it is placed closer to the differential pair 402 than the other and is therefore designated as a primary ground reference. With this assymettrical relationship, the common mode coupling of the pair of differential signal vias is minimized and is defined for subsequent tuning of the impedance of the system, i.e., along its extent through the circuit board. The ground plane 405 is connected to both ground vias on the top and bottom surfaces of the circuit board as illustrated in FIG. 9, if ground planes are used in that fashion and as illustrated in FIG. 10, it is preferred that the inner ground plane layers are selectively connected to the ground vias. In FIG. 9, it will be noted that the ground plane 405 takes the form more of a grid or lattice like structure, rather than a large solid ground plane layer. Such a grid or lattice is indicated for use for areas of circuit boards that have a high density of pairs of differential signal vias.

In FIG. 10, a multiple layer, or plane, circuit board is shown, with the resin or other insulative material removed for clarity. The ground planes 405a, 405b are disposed on opposing top and bottom surfaces of the circuit board and they are connected to both of the ground vias 403 & 404. In the inner ground reference plane layers 405c & 405d, there is no connection between the ground planes and either of the two vias 403, 404. A pair of signal traces 420 are shown exiting from the differential signal via pair 420 between ground plane layers 405e and 405f. In order to optimize the via performance through the circuit board 400 and its stack of layers, the two ground planes that flank the signal traces 420 are connected to the ground vias 403, 404.

The exit paths that the conductive signal traces 420 take between the three vias 401-403 is shown best in FIG. 10A. FIG. 10A is a top plan view of the via and ground plane structure of FIG. 10, illustrating the ground plane on the top surface of the circuit board (with the board structure removed for clarity) and illustrating the connection of two inner signal traces to the differential signal via pair. This also illustrates the path which the signal traces 420 take in their route out, or exit from the differential signal vias.

Signal Trace Breakout From Vias

It is also desirable to control the impedance of the transmission lines in the area in which the traces exit from the vias and continue their transmission path on the circuit board. Problems arise in these exit areas. Previously it was known to attempt to maintain the spacing of the conductive trace pair in symmetrical arrangements around a center line running between the differential signal via pair. This is shown in FIG. 14, where two vias 501, 502 of a pair of differential signal vias are spaced apart from each other by a distance D. A pair of conductive traces 503 are connected to the vias 501, 502 and exit therefrom. Their exit path extends initially out at an angle along exit portions 504 of the traces toward a centerline C that separates the two vias 501 until the traces are separated by a uniform spacing DD. These exit portions 503 have a short length and do not intersect each other in their extent, but they join corresponding elongated portions 505 that extend parallel to each other on opposite sides of the centerline C. The two vias 501, 502 and their associated traces 503 define a signal transmission line of the circuit board 500 supporting them. With a single pair of differential signal vias, the needed spacing, geometry and the length of the two traces may be kept symmetrical so that any variances in the exit are kept to an absolute minimum. By maintaining the geometry and symmetry of the circuit trace, the impedance can be controlled in this area. However, it is not always possible to route out traces from vias in a symmetrical pattern, especially in areas of the circuit board where there is a high density, or closely spaced pairs of differential signal vias.

Problems will arise when the conductive traces leading from a pair of differential signal vias are staggered so that the traces are either not of equal length, or are not symmetrical in their pattern as a pair. Such a problematic arrangement is illustrated in FIG. 15 where a circuit board 500 is illustrated as having an array of vias 501, 502 arranged in pairs in two lines. Two of the vias 501, 502 form a differential signal pair and two conductive traces 505, 506 are shown leading from the vias to a signal transmission line 507. The one trace 506 has a short exit portion 510, while the other trace 505 has a longer exit portion 511 to account for the spacing between the two vias 501, 502. The signal transmission line 507 portion of the traces extends between the two rows of vias. In order to ensure that the impedance of the signal transmission line will maintain a desired value, it becomes necessary to equalize the length of the transmission line portion 507 to take into account the difference in the lengths and angles of the two exit portions 510, 511 of the traces. This is done by inserting a compensating portion 512, shown as a partial loop, which increases the overall length of the trace 506 without unduly increasing the lateral length. However, the use of such a compensating portion 512 takes up valuable space on the circuit board which otherwise could be used for additional circuitry and therefore this solution to controlling the impedance of a circuit board signal transmission line is undesirable.

Figure 11:
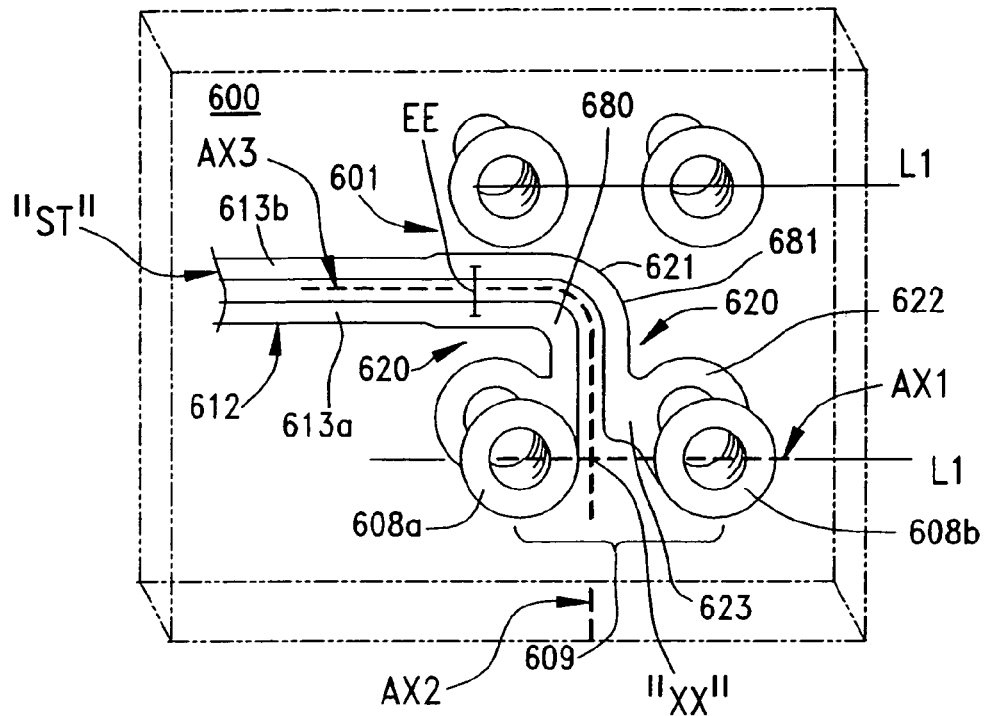
FIG. 11 is a top plan view, taken at a slight angle, illustrating a pair of differential signal vias and a pair of conductive traces exiting, or "launching" or "breaking out" from the vias and meeting a differential signal transmission line.
Figure 11A:
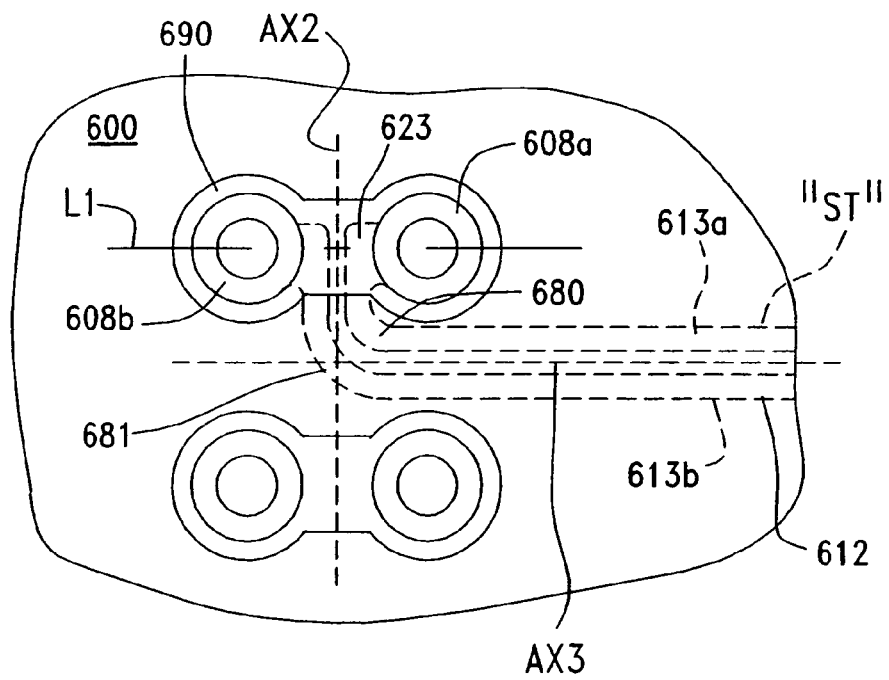
FIG. 11A is a top plan view of a structure similar to that shown in FIG. 11, but where the exit portion has a flag configuration and not an increased width portion.
Figure 12:
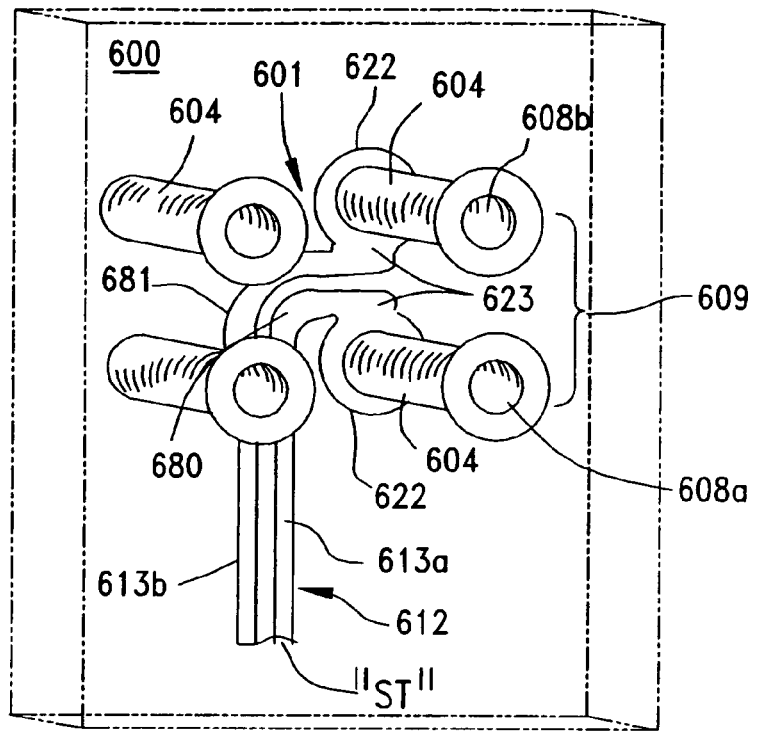
FIG. 12 is the same view as FIG. 11, but oriented 90 degrees and slightly more in perspective and illustrating the depth of the vias and the signal trace breakouts connected to the signal vias.
Figure 13:
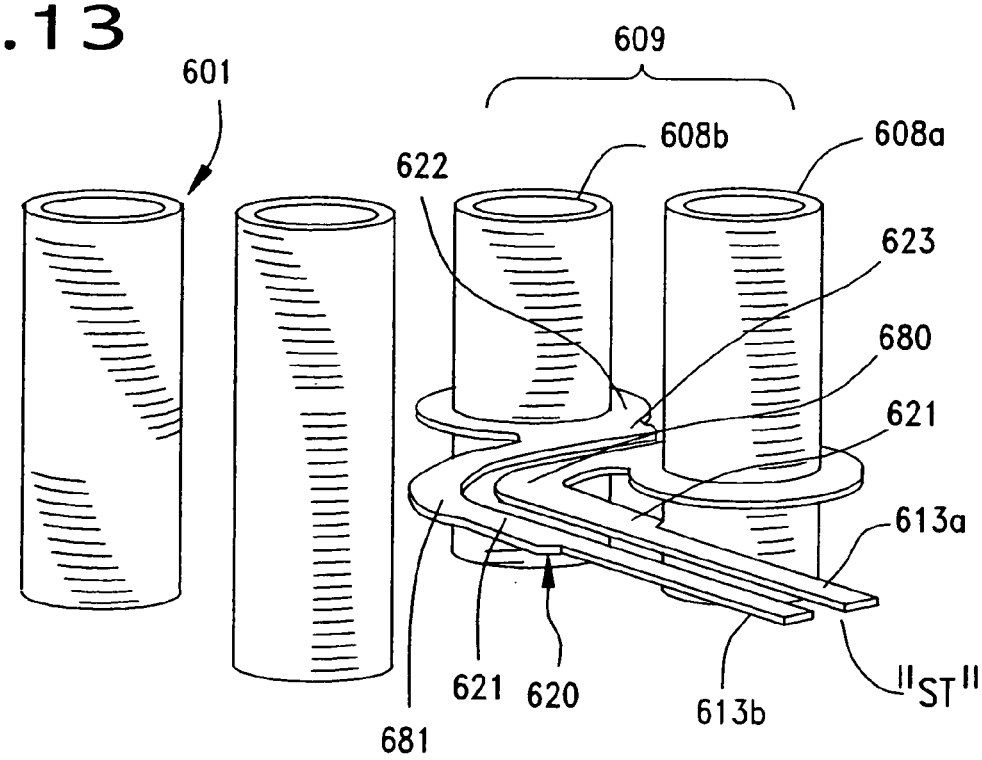
FIG. 13 is a perspective view of the arrangement of FIG. 1, taken from an end thereof at a different angle, and illustrating how the circuit traces exit from their two associated vias and illustrating the increased width portions of the conductive traces.

FIGS. 11-13 & 11A illustrate one embodiment of a circuit board 600 having a circuit trace pattern 601 that provides desirable impedance characteristics of a signal transmission line 610 that exits from a pair 609 of differential signal vias 608a, 608b. With this arrangement, it has been discovered by us that it is possible to "tune" the performance of the transmission system from the vias 608a, 608b all the way their associated signal transmission line 612, which as shown, is formed from two conductive traces 613a, 613b. The circuit trace pattern shown in these Figures is one that is typically found on an inner layer of the circuit board 600 and the two traces 613a, 613b mate with the differential signal vias 608a, 608b along their plated body portions 604. (FIG. 12.) In using patterns of the invention, we have found that it is possible to launch the energy of the system as the traces break away or "out" from the differential signal vias. These structures serve to return energy to the system. In this manner, the invention can provide a continuously coupled differential trace pair from a point that is nominally between the via pair.

As stated above, a large concentration of energy occurs at the pair of vias 609, and in order to recapture this energy, the via exit portions 620 have enlarged width portions, or areas, 621 which are joined to the vias by way of annular collar portions 622. The enlarged width portions 620 are further joined to the via plating 622 with what we describe as "flag" portions 623. These flag portions 623, and in part, the enlarged width portions 621 present more metal plate area to increase the capacitance in the area between the vias where the electrical energy is concentrated. The flag portions 623 give a good 90 degree centerline exit to the beginning of the exit portions.

As shown best in FIG. 11, the two pairs of vias disposed in the circuit board 600 are arranged along a first axis L1. The lower pair of vias in the Figure are a pair of differential signal vias, and the conductive trace exit portions 620 are of enlarged width and extend first along that first axis toward each other, and then at an angle outwardly from that first axis along a second axis, designated AX2 in FIG. 11, which preferably extends transverse to first axis L1 as illustrated. They then turn along a pair of bends 680, 681 that have a radius so that one trace 613a fits inside of the other trace 613b and continue along a third axis AX3, that is generally parallel to axis L1 and which is generally transverse to axis AX2. In this manner, a constant spacing EE may be obtained between the two traces from the area XX where the flag portions 623 extend out toward each other to the area where the exit portions join the signal transmission area ST. This is to provide continuous coupling of the differential signal traces.

FIG. 11A is a top plan view of the exit portions of a pair of traces. In this embodiment, the two differential signal vias are surrounded by a dogbone-style opening 690 similar to that shown in FIG. 5. As mentioned above, and as illustrated in this embodiment, the exit portions 723 of the traces take the form of flag-type structures, which are plate-type areas in lieu of thin traces leading away from the vias. These plate areas increase the capacitive coupling between the traces at the via area and also lower the inductance. The flag portions also approach each other (extend along a first axis) to maintain the desired separation distance between the traces in their exit from the vias, and subsequently, the exit portions extend out from the flag portions along a second axis which intersects the first axis. It can be seen that the traces follow three different paths, first along the axis L1, then secondly along the axis AX2 and then lastly along the axis AX3. Axes L1 and AX2 intersect, as do axes AX2 and AX3.

FIG. 13A is a top plan view of another embodiment of the invention showing the exit path of a pair of conductive traces 550 from a pair of vias 551 until they join to a signal transmission line 552. The traces 550 include flag portions 555 as part of their exit portions with enlarged plate areas that exit from the vias toward each other along an axis L1. One of the traces 550a lies inside of the other trace 550b as it curves back upon itself to the signal transmission line portions 552 that extends generally transverse to the axis L1. The exit portions further traverse a path that has approximately five distinct bends in it, with each bend of the structure of FIG. 13A being identified by the lines B-B and each bend representing an occurrence when the trace exit portions change direction.

A ground reference plane 590 is shown superimposed above the trace exit pattern. In this layer of the circuit board, the reference plane 590 and the and the annular collar portions 591 are found. They are shown as located in a layer above the trace exit pattern, but they could also be located in a layer beneath the trace exit pattern. There are two ground vias 593 that are interconnected to the ground plane 590 and they are located at edges of the opening 594 formed in the ground plane that encompasses the two differential signal vias 551. One of the ground vias 593a is the primary ground via that is associated with the pair of differential signal vias 551, and the other ground via 593b is one that is associated with the pair of differential signal vias that is to the left and not shown in FIG. 13A. The pair of differential signal vias 551 are located closer to their associated ground via 593a, being spaced away therefrom a distance W1, which is shorted than the distance W2 the pair is spaced from the ground via 593b. The annular collar portions 595 of these ground vias have been removed as shown on the right half of the ground vias in FIG. 13A so that they do not extend along a circular path of 360 degrees. Rather, it is preferred that these type of annular collar portions have a curved extent of about 150 to 200 degrees, with about 180 degrees being preferred. This is done to reduce capacitive coupling between the signal traces exit portions and the non-associated ground via 593b.

Figure 16:
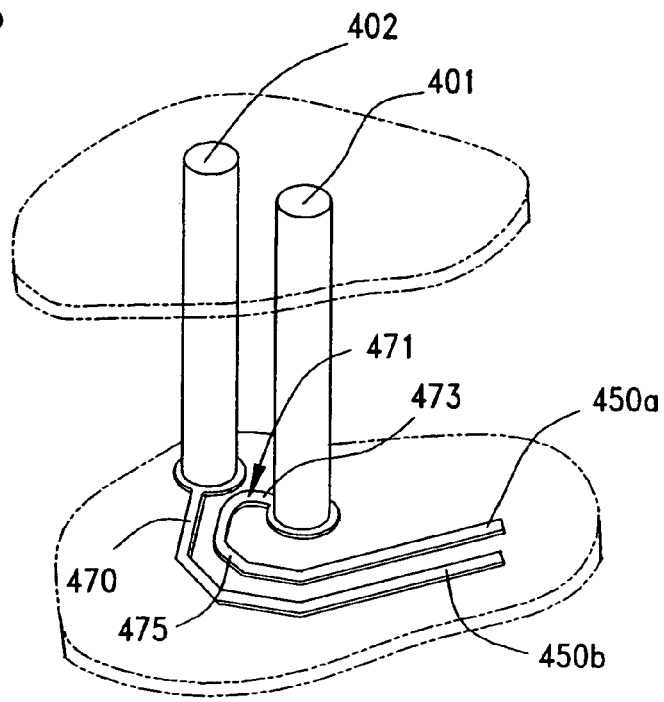
FIG. 16 is a perspective view of another embodiment of a the differential signal trace exit pattern.

FIG. 16 illustrates another style of circuit trace exit or breakout pattern constructed in accordance with the principles of the present invention. In this arrangement, two conductive traces 450a, 450b exit from a pair of associated vias 401, 402. The exit portions of these traces 450a, 450b include one trace portion 471 with a tight bend radius that is nested within the other trace bend portion 470. This inner trace 471 may be considered as bending back upon itself as it initially extends from the via 401 toward its other paired via 402 and then turns upon itself. The significant part of this structure may be found in the initial portion that extends out from the via 401 to the other paired via 402. The trace then continues with a curved portion that is spaced close to the exit portion 471 of the outer via. In this manner, both the closeness of the two traces is maintained as well as similar path lengths.

Figure 16A:
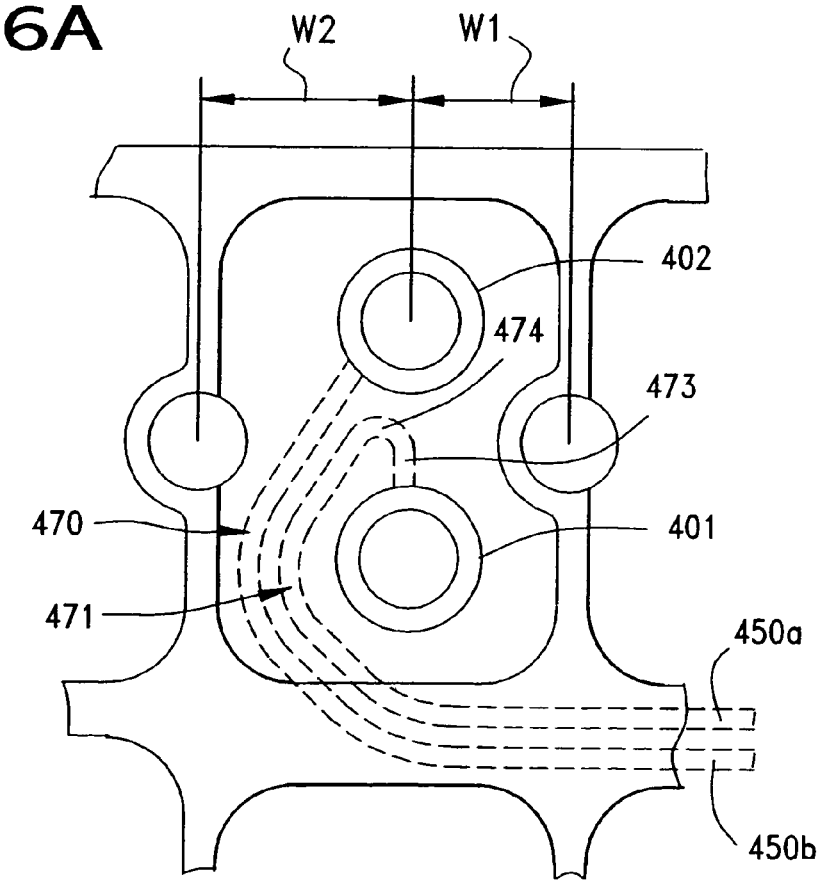
FIG. 16A is a top plan view of the differential signal trace exit pattern of FIG. 16 with a ground reference plane superimposed over the trace pattern.

FIG. 16A is a top plan view of FIG. 16, and it illustrates, in a manner similar to FIG. 13A, a ground reference plane superimposed either above or beneath the trace exit pattern. In this ground reference plane, the associated ground via is spaced closer tot he pair of differential signal vias than is the non-associated ground via. This Figure shows best how the exit portion 473 first extend out from its via 401 toward the other via 402 of the via pair in order to establish the separation distance. It then loops back upon itself at 474 at a point where it may follow the interior of the outer via at a desired separation distance.

Figure 17A:
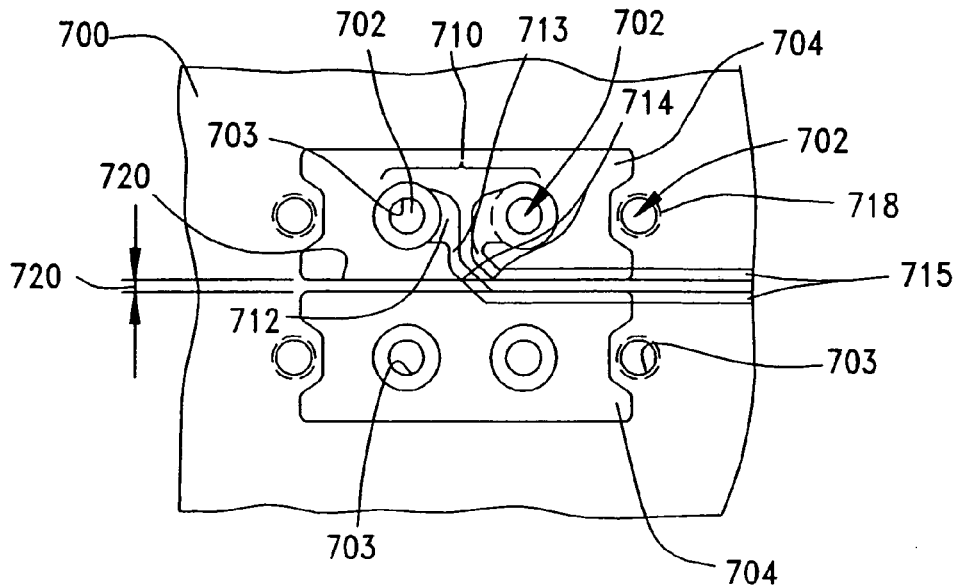
FIG. 17A is a top plan view of another embodiment of a circuit board route out constructed in accordance with the principles of the present invention and illustrating a narrow spacing between two openings formed in the ground plane of the circuit board.
Figure 17B:
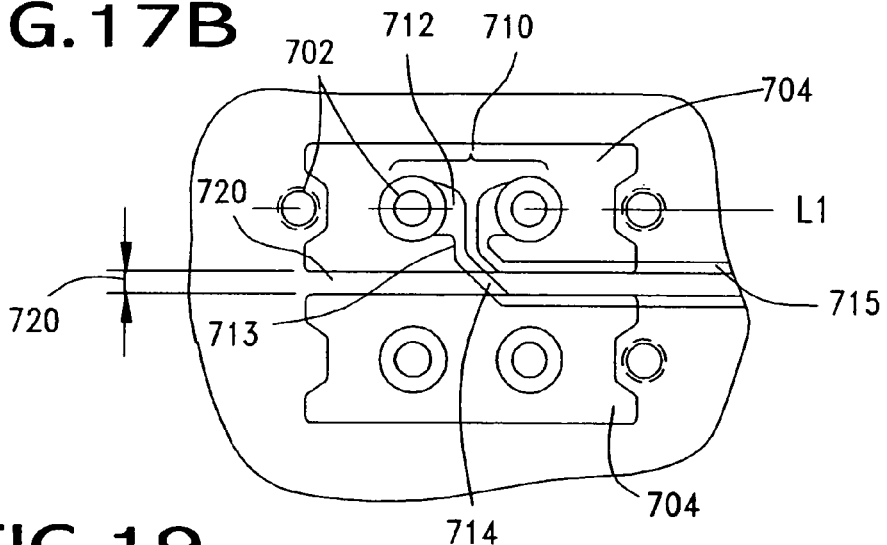
FIG. 17B is the same view as FIG. 17A, but with a wider spacing inserted between two openings formed in the ground plane of the circuit board.

FIG. 17 illustrates another embodiment of a circuit board exit pattern constructed in accordance with the principles of the present invention and which utilizes a series of plated vias 702 that are formed in a printed circuit board. The circuit board 700 is shown in top plan view and it can be seen to include six pairs of vias, or through holes, 702 that extend completely through the thickness of the circuit board 700. These vias 702 are spaced apart from each other along both the X and Y direction (or up to down and right left in FIGS. 17A and 17B), and they are preferably plated on their interior surfaces 703 so that they will conductively connect with conductive elements inserted into them. An anti-pad or opening 704 is also shown, and this area 704 is an area in a conductive ground reference plane in which the conductive metal, i.e. plating, has been removed. Importantly, this area completely encompasses a selected pair 710 of signal vias (and this pair is a pair of vias in the right to left direction of the Figures). This pair 710 of vias is intended to be used with differential signal circuits so that one of the vias of the pair 710 will carry a positive (+) voltage of a given magnitude, while the other via of the pair 710 will carry a negative (−) voltage signal of the same magnitude as described above. These two differential signal vias collectively constitute a differential signal via pair 710. Two other vias 718 are shown and they may be positioned along a common axis L1 (FIG. 17B) and serve as ground vias inasmuch as they are connected to the ground plane layer 700. The non-conductive opening 704 is seen to abut these two ground vias 718.

In this embodiment, circuit board traces are connected to the differential signal via pair 710. The beginning of the circuit board traces as they exit from the pair 710 of vias includes a wide, flag-like portion 712. These flag portions 712 include a relatively large amount (or width) of conductive material as compared to the width of their final associated circuit board trace. This extra material increases to the size of the "plate" that is defined by the flag portion and increases capacitive coupling between the two traces exiting from the via pair 710. The large size of the flag portion 712 serves to re-establish capacitive coupling between the two traces of the pair 710 of signal vias in the horizontal plane of the circuit board. Previously, capacitive coupling had been established between the two signal vias 710 in the vertical plane along the path of the vias through the circuit board, while these flag portions 712 form a transition of the traces into the horizontal plane. This effectively increases the impedance in this initial transition of the trace exits from the pair of vias 710. The flag portions 712 serve as an initial transition from the vertical plane to the horizontal plane.

The flag portions 712 are preferably evenly sized and are symmetrical in order to provide a constant capacitance therebetween. This symmetry extends along an axis that runs between the pair 710 of vias and between the flag portions 712. This is preferred so as to create an equal path length at the beginning of the exit so as to establish a zero ("0") skew. The flag portions 712 re-establish the coupling in the horizontal plane before the traces "break out" from the vias and continue their circuit paths along the circuit board. The next portions 713 of the circuit traces include the break out area and they are seen best in FIG. 17A, where it can be seen that these trace portions are preferably of the same width. Their route out from the vias attempts. to take the shortest path to get to the main trace portions 715 that extend along the edges of the openings 704 of the ground plane. These main trace portions 715 extend along the intervening, thin web 720 of conductive material that separates the two anti-pad areas illustrated in the Figures. In this regard, the path of one of the two exit portions of the trace mimics the path of the other of the two traces.

A stub portion 713 of the traces can be seen extending out from each flag portion 712 and these stub portions 713 meet and mate with an angled leg portion 714 that extend from the stub portions 713 to locations flanking the ground web 720 separating two adjacent anti-pad areas 704. These angled trace portions 714 then meet with the regular circuit portions 715 of the traces that run parallel to the ground plane intervening web portions 720 that separate the two ground plane openings 704. The circuit trace flag portions 712 and transmission line portions 715 are separated from each other by a common spacing. The ground plane intervening web portion 720 of FIG. 17A is shown as a thin ground web, while the ground plane intervening web portion 720 shown in FIG. 17B has a larger relative width. This exit path of the circuit board traces accomplishes the goal of getting the signal traces close to the ground plane layer using the shortest possible path length in order to provide a smooth impedance transition to the circuit system.

The particular style of ground plane opening 704 that is shown in FIGS. 17A & 17B is a larger size of opening than is shown in FIGS. 9 and 10A and this is done so as to remove enough of the ground plane so that is has a lesser effect on the vertical coupling that occurs between the pair 710 of signal vias 702.

Figure 18:
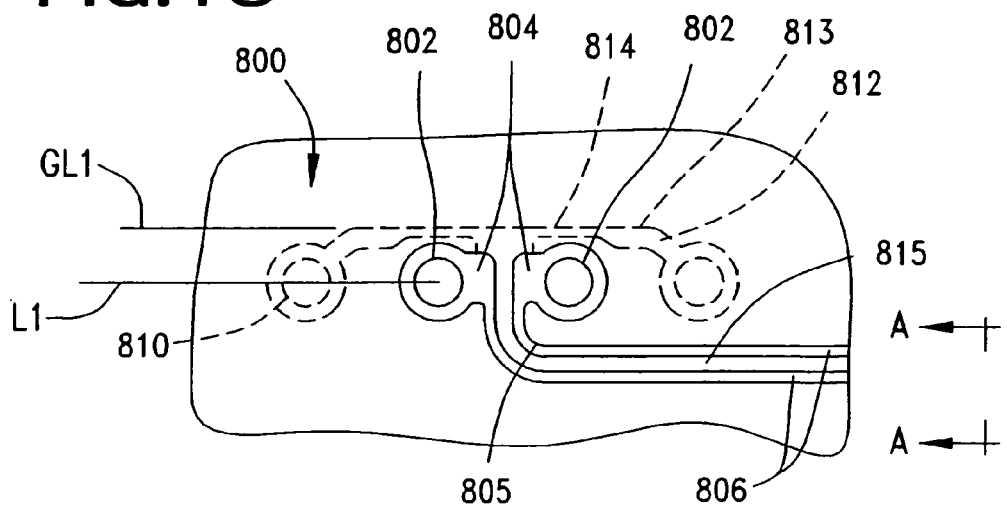
FIG. 18 is a top plan view of another embodiment of a circuit board route out from four vias, illustrating the use of a triad-style arrangement of traces.
Figure 18A:
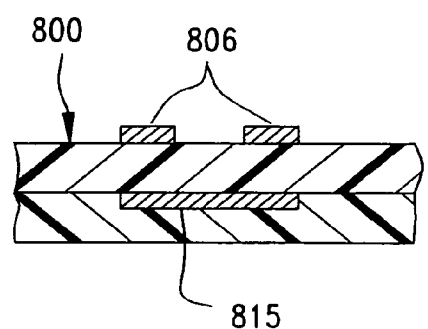
FIG. 18A is a sectional view of FIG. 18 taken along lines A-A thereof, illustrating the triad-style arrangement of the circuit board traces in their path on the circuit board.
Figure 18B:
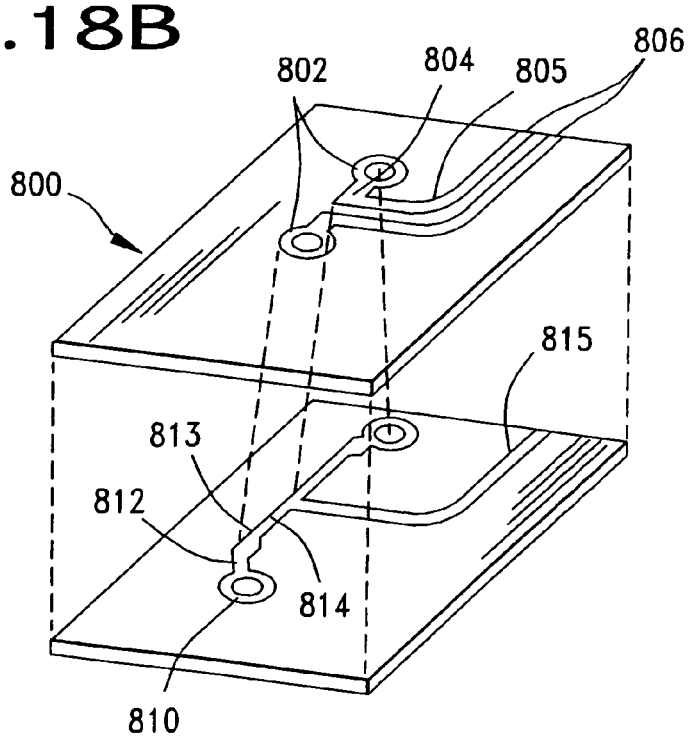
FIG. 18B is a diagrammatic view of FIG. 18 illustrating the vertical spacing between traces used on different layers of the circuit board; and, FIG. 19 is a top plan view of another embodiment of a triad-style arrangement of circuit board trace exits.

FIGS. 18-18B illustrate a "triad"-style arrangement 800 of via exit structures. A pair of differential signal vias 802 are illustrated in FIG. 18 as spaced apart from each other in the right to left direction of the Figure. The exit structure of these two vias 802 includes flag portions 804, curved portions 805 and trace portions 806. A pair of ground vias 810 may be provided outside of the pair of differential signal vias 802 and they may be aligned with the signal vias 802 along a horizontal line. These ground vias 810 are shown in phantom in FIG. 18 and include angled trace portions 812 that begin the ground via exit structures, enlarged portions 813, thin portions 814 and a relatively wide center trace portion 815. This wide trace portion 815 preferably has a width such that the edges thereof lie beneath or outboard of the edges of the pair of differential signal trace portions 806. This relationship is shown best in FIG. 18A, and the vertical separation of the ground via exit structures and the signal via exit structures is best shown in FIG. 18B.

Figure 19:
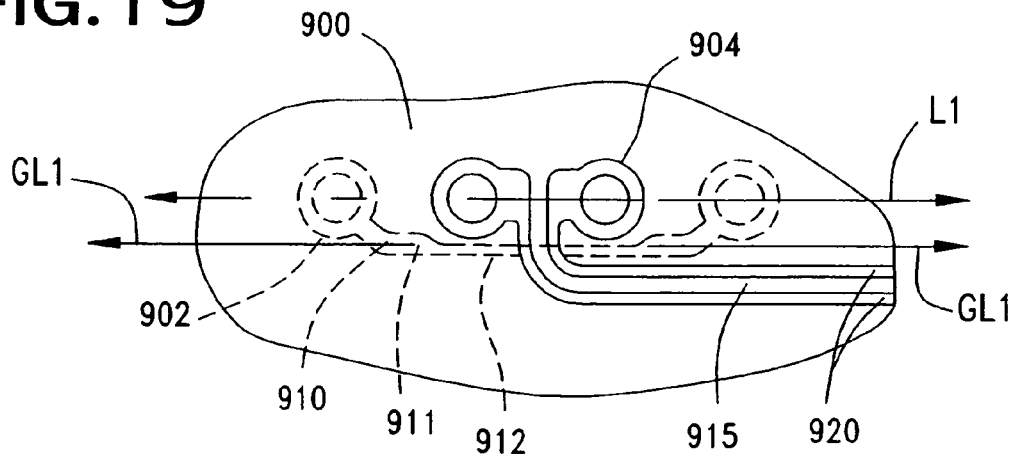

FIG. 19 illustrates another embodiment of a triad exit structure 900 in which the ground vias 902 are located outside of the signal vias 904 and in which their associated exit structure lies on the other side of the signal vias (shown below the signal vias as opposed to being shown above the signal vias as in FIG. 18B). One may consider the signal and ground vias to be aligned along a common axis L1 (FIG. 19). The flag-shaped trace exit portions are aligned along this axis, but the trace exit portions from the ground vias shown in FIG. 19 and FIG. 18 are offset from L1 and are aligned along a second axis GL1. In some instances, the signal and ground trace exit portions may be aligned along a common axis.

The ground vias 902 have angled exit portions 910 that lead to straight portions 911 and then lead to thin portions 912. As in the exit structures shown in FIG,. 18B, the thin portions 911 are positioned where the exit traces approach near the signal vias 904 in order to minimize signal to ground coupling of the system near the flag portions of the signal exit structures. The two ground exit traces 912 then join together to form a wide center strip 915 that is aligned with and beneath (in terms of board layers) the signal traces 920. It can be seen in both FIGS. 18 and 19 that the trace ground via exit portions initially begin their journey out away from the ground vias 810, 902 with wide portions 812, 910 that narrow down to thinner portions 814, 912 as they near their associated signal vias and then join together to form a wide, common transmission line trace 815, 915.

While the preferred embodiment of the invention have been shown and described, it will be apparent to those skilled in the art that changes and modifications may be made therein without departing from the spirit of the invention, the scope of which is defined by the appended claims.

The invention claimed is:

1. A circuit board having a high-speed via system for differential signal circuits, comprising:
   a pair of differential signal vias disposed in the circuit board and spaced apart from each other along an axis, conductive trace exit portions extending away from the differential signal vias, also along the axis and toward each other, the signal conductive trace exit portions joining to corresponding signal conductive transmission line portions that lead elsewhere on said circuit board;
   a pair of ground vias disposed in said circuit board and spaced apart from each other outside of the differential signal pair of vias, a pair of conductive trace ground exit portions leading away from the ground vias and spaced apart from said signal conductive trace exit portion, the two conductive trace ground exit portions joining together to form a single conductive ground trace that extends between at least portions of said conductive signal traces.

2. The circuit board of claim 1, wherein said single conductive ground trace extends between said signal conductive trace transmission line portions and part of said signal conductive trace exit portions.

3. The circuit board of claim 1, wherein said conductive trace ground exit portions have a width that narrows as said conductive trace ground exit portions pass near said differential signal vias.

4. The circuit board of claim 1, wherein said conductive trace ground portions are spaced apart from said axis.

5. The circuit board of claim 1, wherein said ground vias are disposed along said axis.

6. The circuit board of claim 5, wherein said differential signal vias are disposed between said ground conductive trace exit portions and said signal conductive transmission line portions.

7. The circuit board of claim 5, wherein said ground conductive trace exit portions are disposed between said differential signal vias and said signal conductive transmission line portions.

8. A circuit board having a high-speed via system for differential signal circuits, comprising:
   a pair of differential signal vias disposed in the circuit board and spaced apart from each other along an axis, signal conductive trace exit portions disposed in a first layer of said circuit board, the signal conductive trace exit portions extending away from the differential signal vias and toward each other along a first axis, the signal conductive trace exit portions joining to corresponding signal conductive transmission line portions that lead elsewhere on said circuit board;
   a pair of ground vias disposed in said circuit board and spaced apart from each other outside of said differential signal vias, a pair of ground conductive trace exit portions disposed in a second layer of said circuit board, the ground conductive trace exit portions extending away from the ground vias and toward each other along a second axis, said ground conductive trace exit portions being spaced apart from said signal conductive trace exit portion, the two conductive trace ground exit portions merging together to form a single ground conductive ground trace that extends between at least portions of said conductive signal traces.

9. The circuit board of claim 8, wherein said single conductive ground trace extends between said signal conductive trace transmission line portions and part of said signal conductive trace exit portions.

10. The circuit board of claim 8, wherein said ground conductive trace exit portions have a width that narrows as said ground conductive trace exit portions extend near said differential signal vias.

11. The circuit board of claim 8, wherein said ground conductive trace exit portions extend along a second axis that is spaced apart from said axis.

12. The circuit board of claim 8, wherein said ground vias are disposed along said axis.

* * * * *